(12) United States Patent
Howard et al.

(10) Patent No.: US 6,734,073 B2
(45) Date of Patent: May 11, 2004

(54) METHOD FOR MANUFACTURING A BIPOLAR JUNCTION TRANSISTOR

(75) Inventors: Gregory E. Howard, Dallas, TX (US); Angelo Pinto, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 180 days.

(21) Appl. No.: 10/007,931

(22) Filed: Dec. 7, 2001

(65) Prior Publication Data

US 2002/0076892 A1 Jun. 20, 2002

Related U.S. Application Data

(60) Provisional application No. 60/256,943, filed on Dec. 19, 2000.

(51) Int. Cl.[7] .............................................. H01L 21/331
(52) U.S. Cl. ...................................... 438/341; 438/309
(58) Field of Search .................................. 438/309, 341

(56) References Cited

U.S. PATENT DOCUMENTS 5,102,809 A * 4/1992 Eklund et al. ............... 438/154
5,451,532 A * 9/1995 Bashir et al. ................ 438/366

OTHER PUBLICATIONS

Wolf, S., Tauber R.N.; Silicon Processing for the VLSI Era vol. 1: Process Technology, Lattice Press, Sunset Beach, CA, 1986, pp. 57–58.*
Fahey, P. M., et al., "Point Defects and Dopant Diffusion in Silicon," *Reviews of Modern Physics*, vol. 61, No. 2, Apr. 1989, pp. 289–384.
Warnock, James D., "Silicon Bipolar Device Structures for Digital Applications: Technology Trends and Future Directions," *IEEE Transactions on Electron Devices*, vol. 42, No. 3, Mar.1995, pp. 377–389.
Burghartz, Joachim N., et al., "Identification of Perimeter Depletion and Emitter Plug Effects in Deep–Submicrometer, Shallow–Junction Polysilicon Emitter Bipolar Transistors," *IEEE Transactions on Electron Devices*, vol. 39, No. 6, Jun. 1992, pp. 1477–1489.

Onai, Takahiro, et al., "Self–Aligned Complementary Bipolar Technology for Low–Power Dissipation and Ultra–High–Speed LSI's" *IEEE Transactions on Electron Devices*, vol. 42, No. 3, Mar. 1995, pp. 413–418.

Van Wijnen, Paul J., et al., "A New Approach to Optimizing the Base Profile for High–Speed Bipolar Transistors," *IEEE Electron Device Letters*, vol. 11. No. 4, Apr. 1990, pp. 149–152.

* cited by examiner

*Primary Examiner*—John F. Niebling
*Assistant Examiner*—Christopher Lattin
(74) *Attorney, Agent, or Firm*—Peter K. McLarty; W. James Brady, III; Frederick J. Telecky, Jr.

(57) ABSTRACT

According to one embodiment of the invention, a method for manufacturing a bipolar junction transistor includes implanting a first base dopant in a semiconductor substrate, forming an epitaxial layer outwardly from the semiconductor substrate, and forming a dielectric layer outwardly from the epitaxial layer. The method also includes etching a first portion of the dielectric layer to form an emitter region, forming an emitter polysilicon layer on the semiconductor substrate, and implanting an emitter dopant in the emitter polysilicon layer. The method further includes etching a portion of the emitter polysilicon layer and a second portion of the dielectric layer to form an emitter polysilicon region having sidewalls, forming nitride regions on the sidewalls, and implanting a second base dopant in the semiconductor substrate. After implanting the second base dopant, an annealing process is performed for the semiconductor substrate to form an emitter and a base.

20 Claims, 4 Drawing Sheets

METHOD FOR MANUFACTURING A BIPOLAR JUNCTION TRANSISTOR

This application claims priority under 35 USC § 119(e)(1) of provisional application Serial No. 60/256,943, filed Dec. 19, 2000.

CROSS-REFERENCE TO RELATED APPLICATIONS

This application is related to a provisional patent application filed on the same date as the instant provisional application, entitled Method For Manufacturing A Bipolar Junction Transistor.

TECHNICAL FIELD OF THE INVENTION

This invention relates generally to the field of semiconductor devices and, more specifically, to a method for manufacturing a bipolar junction transistor.

BACKGROUND OF THE INVENTION

Semiconductor devices are used for many applications, and one component used extensively in semiconductor devices is a transistor. There are many different types of transistors, including bipolar junction transistors. Bipolar junction transistors ("BJTs") are used to make other types of transistors and devices, such as a complementary metal oxide semiconductor ("CMOS"), which utilizes NPN and PNP BJTs for increased performance.

Many factors are considered in manufacturing BJTs. One such factor is dopant diffusion. Dopant diffusion determines how a particular BJT performs and is influenced by such factors as dopant type, implantation energy, the type of material the dopant is implanted in, and the time and temperature of any annealing processes. Problems arise when too much, or too little, diffusion of dopants occurs. For example, depending on the type of BJT being manufactured, any of the above factors can cause undesirable base concentrations and base widths as well as undesirable emitter widths. Accordingly, these undesirable attributes can hurt BJT performance, including reduced speed, band-to-band tunneling, and less than optimal linearity. Therefore, semiconductor manufacturers desire methods of manufacturing BJTs that control the formation and diffusion of dopants so that the performance of BJTs is improved.

SUMMARY OF THE INVENTION

The challenges in the field of semiconductor devices continue to increase with demands for more and better techniques having greater flexibility and adaptability. Therefore, a need has arisen for a new method for manufacturing a bipolar junction transistor.

In accordance with the present invention, a method for manufacturing a bipolar junction transistor is provided that addresses disadvantages and problems associated with previously developed methods.

According to one embodiment of the invention, a method for manufacturing a bipolar junction transistor includes implanting a first base dopant in a semiconductor substrate, forming an epitaxial layer outwardly from the semiconductor substrate, and forming a dielectric layer outwardly from the epitaxial layer. The method also includes etching a first portion of the dielectric layer to form an emitter region, forming an emitter polysilicon layer on the semiconductor substrate, and implanting an emitter dopant in the emitter polysilicon layer. The method further includes etching a portion of the emitter polysilicon layer and a second portion of the dielectric layer to form an emitter polysilicon region having sidewalls, forming nitride regions on the sidewalls, and implanting a second base dopant in the semiconductor substrate. After implanting the second base dopant, an annealing process is performed for the semiconductor substrate to form an emitter and a base.

Embodiments of the invention provide numerous technical advantages. For example, a technical advantage of one embodiment of the present invention is the reduction of the base peak concentration at the polysilicon-to-silicon interface, thereby increasing performance of bipolar junction transistors. Another technical advantage of one embodiment of the present invention is that optimizing the base doping density profile substantially reduces or eliminates the emitter-base band-to-band tunneling problem in bipolar technology. An additional technical advantage of the present invention is that a resulting narrow base width increases the operating frequency of bipolar junction transistors.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Example embodiments of the present invention and their advantages are best understood by referring now to FIGS. 1 through 3D of the drawings, in which like numerals refer to like parts.

Figure 1:
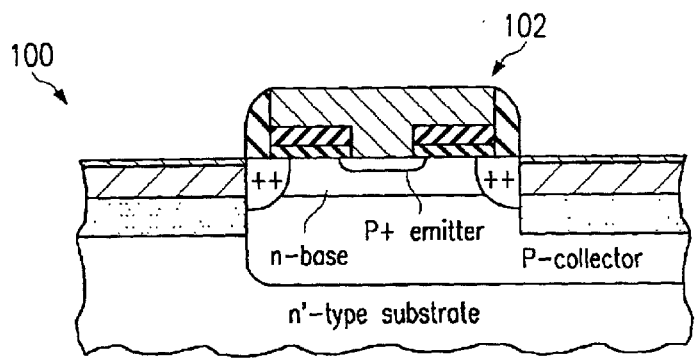
FIG. 1 is a cross-sectional view of a partially completed semiconductor device showing a substantially completed bipolar junction transistor manufactured according to the teachings of the present invention.

FIG. 1 is a cross-sectional view of a partially completed semiconductor device 100 showing a substantially completed bipolar junction transistor ("BJT") 102 manufactured according to the teachings of the present invention. BJT 102 is shown in FIG. 1 to be a vertical PNP bipolar junction transistor; however, BJT 102 may be formed in other configurations, such as a NPN configuration. Many factors are considered in manufacturing bipolar junction transistors; one such factor is dopant diffusion. Dopant diffusion determines how a particular bipolar junction transistor performs and is influenced by such factors as the type of dopant, the energy of implantation, the type of material the dopant is implanted in, and the time and temperature of any annealing processes performed. Problems arise when too much, or too little, diffusion of dopants occurs. For example, depending on the type of BJT being manufactured, any of the above factors can cause undesirable base concentrations and base widths as well as undesirable emitter widths. These undesirable attributes can hurt bipolar junction transistor performance, including reduced speed, band-to-band tunneling, and less than optimal linearity. The present invention addresses these problems, and others, by providing a method of manufacturing BJT 102 that includes forming an additional epitaxial layer. One embodiment of such a method is illustrated with reference to FIGS. 2A through 2H.

FIGS. 2A through 2H are a series of cross-sectional views illustrating various manufacturing stages of BJT 102 in accordance with the teachings of the present invention.

Figure 2A:
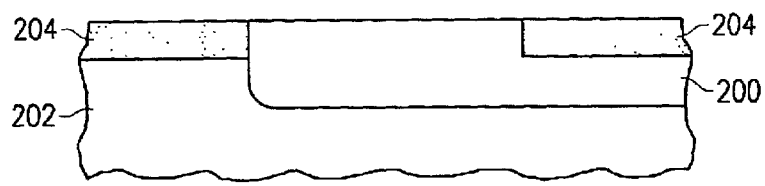
FIGS. 2A through 2H are a series of cross-sectional views illustrating various manufacturing stages of the bipolar junction transistor of FIG. 1.

FIG. 2A shows a collector 200 formed in a semiconductor substrate 202 and disposed between isolation regions 204. Collector 200 is a P-type collector if BJT 102 is a PNP bipolar junction transistor or an N-type collector if BJT 102 is an NPN bipolar junction transistor. In the embodiment shown in FIG. 2A, collector 200 is a P-type collector; therefore, collector 200 includes one or more doped regions formed from, for example, a gas such as boron. These doped regions may take the form of, for example, a P-well along with a buried P+ region.

Semiconductor substrate 202 is either an N-type substrate or a P-type substrate depending on the type of BJT 102. In a PNP bipolar junction transistor, semiconductor substrate 202 is an N-type substrate, and in an NPN bipolar junction transistor semiconductor substrate 202 is a P-type substrate. Semiconductor substrate 202 may be formed from any suitable type of semiconductor material, such as silicon.

Isolation regions 204 are, in one embodiment, oxide regions formed using a shallow trench isolation ("STI") process well known in the art of semiconductor processing; however, isolation regions 204 may be formed using other methods and may be formed from any suitable type of dielectric material, such as other oxides or nitrides. Isolations regions 204 serve to isolate adjacent bipolar junction transistors formed in semiconductor device 100.

Figure 2B:
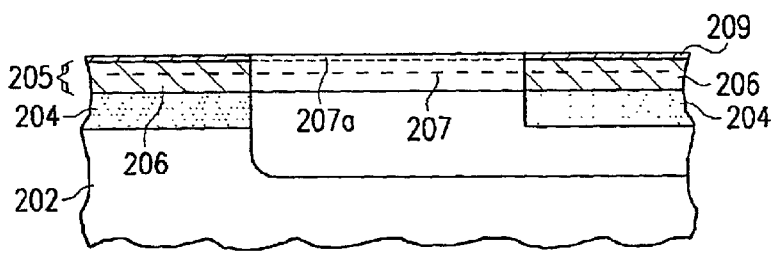

FIG. 2B shows an epitaxial silicon layer 205 formed outwardly from semiconductor substrate 202, a base dopant 207 implanted in epitaxial silicon layer 205, a base dopant 207a implanted in epitaxial silicon layer 205, and an epitaxial silicon layer 209 formed outwardly from epitaxial silicon layer 205. As illustrated in FIG. 2B, epitaxial silicon layer 205 forms epitaxial polysilicon regions 206 outwardly from isolation regions 204 and forms additional epitaxial silicon between these regions. Epitaxial silicon layer 205 is silicon used for implanting base dopant 207 and, in one embodiment, base dopant 207a.

After forming epitaxial silicon layer 205, base dopant 207 is implanted using any suitable implantation process. In one embodiment, this includes forming a thin oxide layer on semiconductor substrate 202, implanting base dopant 207, and thereafter stripping the oxide. In the embodiment shown in FIG. 2B, base dopant 207 (denoted by the "−'s") is formed from a gas, such as arsenic; however, base dopant 207 may be a P-type dopant formed from a gas, such as boron. In an embodiment where BJT 102 is a PNP type, base dopant 207a may be implanted after the implantation of base dopant 207 using any suitable implantation process. If utilized, base dopant 207a is implanted using a low-dose of dopant, such as phosphorus, to help ensure a base 229 (FIG. 2H) of the PNP bipolar junction transistor has sufficient up-diffusion so that the concentration of base 229 at an interface 213 (FIG. 2E) is high enough to avoid inversion in the extrinsic base regions. The NPN type bipolar junction transistor does not need base dopant 207a because the up-diffusion of a P-type base (such as boron) is sufficient.

After all desired base implants are performed and the oxide is stripped, an annealing process may be performed to improve the deleterious effects of the implant and to reduce transient enhanced diffusion ("TED"). This annealing process is well known in the art of semiconductor processing as a "damage" anneal. A typical damage anneal is performed at a temperature between approximately 1000° C. and 1050° C. for a time period of approximately five to ten seconds.

According to the teachings of the invention, epitaxial silicon layer 209 influences diffusion of various dopants, thereby resulting in a more efficient, and better performing, BJT 102. In one embodiment, epitaxial silicon layer 209 acts as a buffer for a subsequent emitter diffusion (discussed below in conjunction with FIG. 2H) into semiconductor substrate 202 by absorbing some of base dopant 207 to help reduce the peak concentration of base 229 at interface 213 (FIG. 2E) and to ensure a more square/box-like base doping profile, which results in a number of technical advantages as discussed more fully below in conjunction with FIGS. 3A–3D. In one embodiment, epitaxial silicon layer 209 has a thickness between approximately 300 and 400 angstroms; however, epitaxial silicon layer 209 may have a thickness between approximately 100 and 1000 angstroms.

Figure 2C:
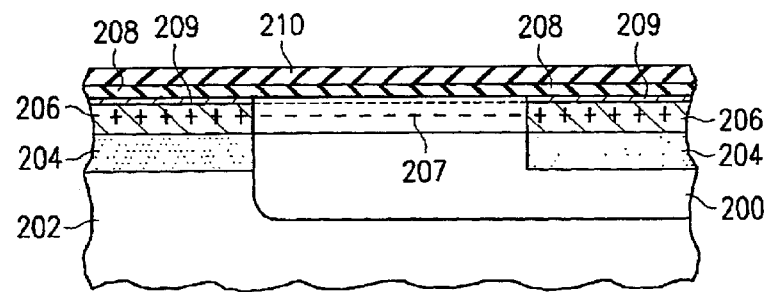

FIG. 2C shows a dielectric layer 217 formed outwardly from epitaxial silicon layer 209. In one embodiment, dielectric layer 217 is formed from a first oxide layer 208 and a first nitride layer 210 formed outwardly from first oxide layer 208; however, dielectric layer 217 may be formed from any suitable type of dielectric material and in any suitable combination. In addition, dielectric layer 217 may be any desired thickness. In the embodiment shown in FIG. 2C, first oxide layer 208 is formed from any suitable type of oxide and is formed using any suitable growth or deposition techniques conventionally used in semiconductor processing. Similarly, first nitride layer 210 is formed from any suitable type of nitride, and is formed using any suitable growth or deposition techniques conventionally used in semiconductor processing. Both first oxide layer 208 and first nitride layer 210 may be any desired thickness. In one embodiment, first oxide layer 208 is approximately 100 Å and first nitride layer 210 is approximately 700 Å.

Figure 2D:
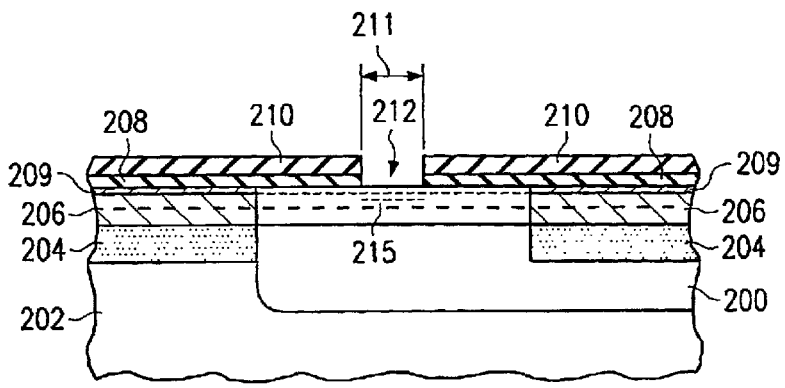

FIG. 2D shows an emitter region 212 formed by removing a portion of first oxide layer 208 and first nitride layer 210, and a base dopant 215 implanted in semiconductor substrate 202 adjacent emitter region 212. Removing a portion of first oxide layer 208 and first nitride layer 210 is accomplished by, for example, anistropically dry etching a portion of first nitride layer 210 and wet etching a portion of first oxide layer 208. Emitter region 212 is the basis for a contact for an emitter 230 (FIG. 2H) of BJT 102. In one embodiment, a width 211 of emitter region 212 is greater than the combined thickness of first oxide layer 208 and first nitride layer 210 to ensure no voids are created when an emitter polysilicon layer 214 (FIG. 2D) is formed.

To avoid over-etching (i.e., etching into silicon below first oxide layer 208) while forming emitter region 212, the wet etch process typically results in a thin oxide layer (approximately 10–20 Å) at the surface of the silicon below first oxide layer 208. To increase the performance of BJT 102 this thin oxide layer needs to be substantially reduced or eliminated to create a good polysilicon to silicon interface 213 (FIG. 2D). As discussed more fully below in conjunction with FIG. 2E, this "oxide break-up" may be accomplished by an annealing process.

The resulting thin oxide layer may also be used, in one embodiment, for implanting base dopant 215. Base dopant 215 is implanted using any suitable implantation process. If utilized in a PNP type bipolar junction transistor, base dopant 215 may be implanted using a low-dose of dopant, such as phosphorus, to create a plateau in the doping profile of base 229 to help ensure that the emitter diffusion lands upon the correct dopant concentration of base 229 (discussed more fully below in conjunction with FIGS. 3A–3D). If utilized in an NPN type bipolar junction transistor, base dopant 215 may be implanted using a low-dose of dopant, such as boron; however, the NPN type bipolar junction transistor may not need base dopant 215 because the segregation of the P-type base into the N-type emitter may be sufficient. After the implantation of base dopant 215, the thin oxide layer at interface 213 may be stripped using any suitable stripping process and/or may be broken-up using an annealing process as described below in conjunction with FIG. 2E.

Figure 2E:
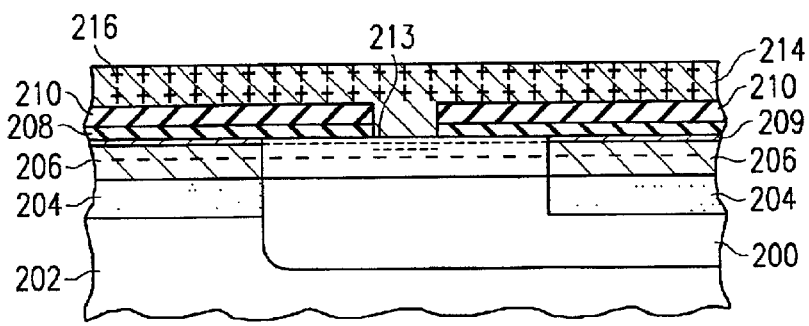

FIG. 2E shows emitter polysilicon layer 214 formed outwardly from first nitride layer 210 and within emitter region 212, and an emitter dopant 216 implanted in emitter polysilicon layer 214. Emitter polysilicon layer 214 is used to form emitter 230 (FIG. 2H) of BJT 102 and for a contact for emitter 230. Emitter dopant 216 (denoted by the "+'s" in FIG. 2E) is the basis for the formation of emitter 230 (FIG. 2H) of BJT 102, and is implanted using any suitable implantation process.

After emitter polysilicon layer 214 is formed, but before emitter implant 216 is implanted, an annealing process may be performed on semiconductor device 100. This annealing process is performed for various reasons. One reason is to diffuse any of base dopants 207, 207a, and 215 away from interface 213 to avoid peaking at interface 213. This diffusion results in a more square/box-like base doping profile, which results in a number of technical advantages as discussed more fully below in conjunction with FIGS. 3A–3D. Another reason for this anneal process is to break-up the thin oxide layer at interface 213 created when emitter region 212 was formed (as discussed above in conjunction with FIG. 2D). In one embodiment, this annealing process is performed at a temperature between approximately 1000° C. and 1100° C. for a time period of approximately ten and forty-five seconds. In a more particular embodiment, this annealing process is performed at a temperature of approximately 1050° C. for a time period of approximately thirty seconds.

Figure 2F:
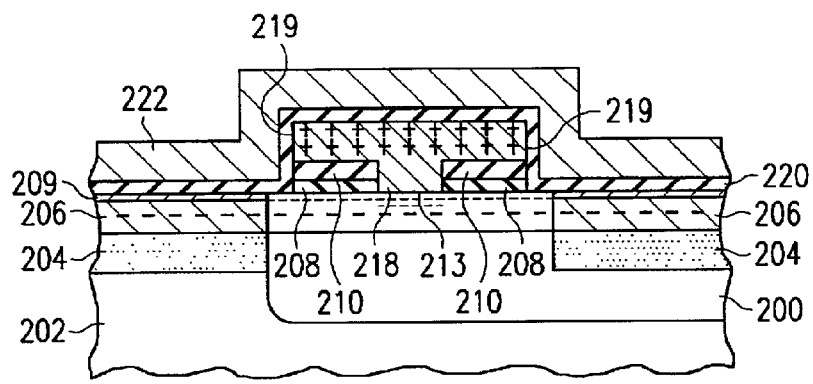

FIG. 2F shows an emitter polysilicon region 218 having sidewalls 219 formed by etching emitter polysilicon layer 214, a second oxide layer 220 formed outwardly from epitaxial silicon regions 206, emitter polysilicon region 218, and sidewalls 219, and a second nitride layer 222 formed outwardly from second oxide layer 220. Emitter polysilicon region 218 is used as a contact for emitter 230 (FIG. 2H) of BJT 102 and as the basis for the formation of emitter 230 of BJT 102.

Second oxide layer 220 is formed from any suitable type of oxide and is formed using any suitable growth or deposition techniques conventionally used in semiconductor processing. Similarly, second nitride layer 222 is formed from any suitable type of nitride, and is formed using any suitable growth or deposition techniques conventionally used in semiconductor processing. Both second oxide layer 220 and second nitride layer 222 may be any desired thickness. In one embodiment, second oxide layer 220 is approximately 100 Å and second nitride layer 222 is approximately 2000 Å. Both second oxide layer 220 and second nitride layer 222 are used in forming nitride regions 224 (FIG. 2G).

Figure 2G:
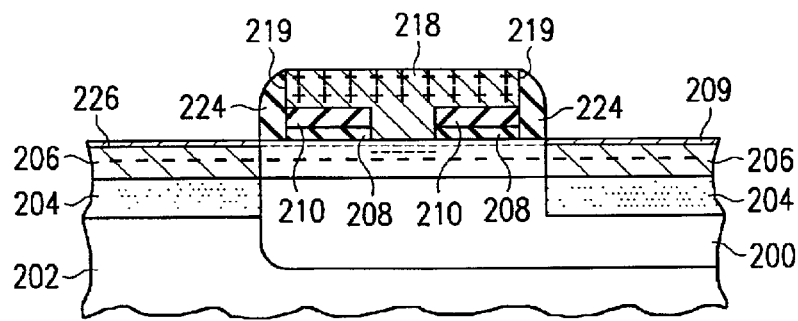

FIG. 2G shows nitride regions 224 formed on sidewalls 219. Nitride regions 224 are formed by an etchback process well known in the art of semiconductor processing, which typically includes dry etching second nitride layer 222 until nitride regions 224 are formed. FIG. 2G further shows a base dopant 226 implanted in at least epitaxial silicon layer 209 using any suitable implantation process. Base dopant 226 is used in forming $N^+$ regions 228 described below in conjunction with FIG. 2H.

Figure 2H:
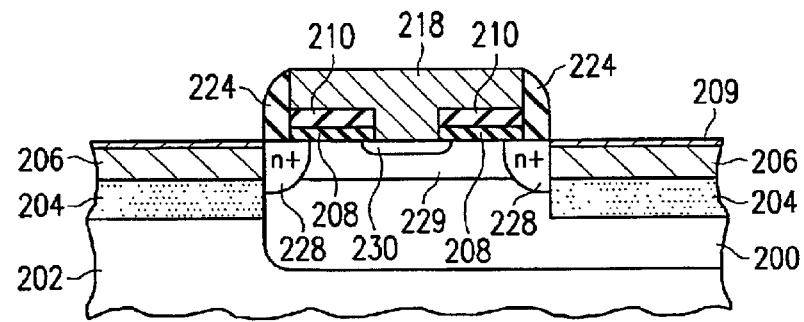

FIG. 2H shows $N^+$ regions 228 formed in base 229 and emitter 230 formed in base 229, which substantially completes BJT 102. $N^+$ regions 228 are highly-doped regions that allow for a better contact of base 229 with epitaxial polysilicon regions 206. $N^+$ regions 228 and emitter 230 are formed as a result of an anneal process according to the teachings of the present invention. Typically, this anneal process is performed at a temperature in the range between approximately 900° C. and 1000° C. for a time period between approximately 10 and 30 seconds depending on the type of dopants used for base 229 and emitter 230. This anneal process results in emitter 230 having a narrower width (i.e., shallower) than that of typical bipolar junction transistors, as well as resulting in a sharper emitter 230\base 229 junction. A shallower emitter 230 and a sharper emitter 230/base 229 junction results in a number of technical advantages as discussed more fully below in conjunction with FIGS. 3A–3D.

According to the teachings of the present invention, BJT 102 results in a more efficient, and better performing, bipolar junction transistor. BJT 102 has increased transition frequency, improved linearity, and reduces or substantially eliminates band-to-band tunneling effects typically found in bipolar technology. The present invention accomplishes this by forming a narrow-width base 229 with a square/box like doping profile (FIGS. 3C and 3D), a shallow emitter 230, and a sharper emitter 230/base 229 junction. These attributes of BJT 102 are described more fully below in conjunction with FIGS. 3A through 3D.

Figure 3A:
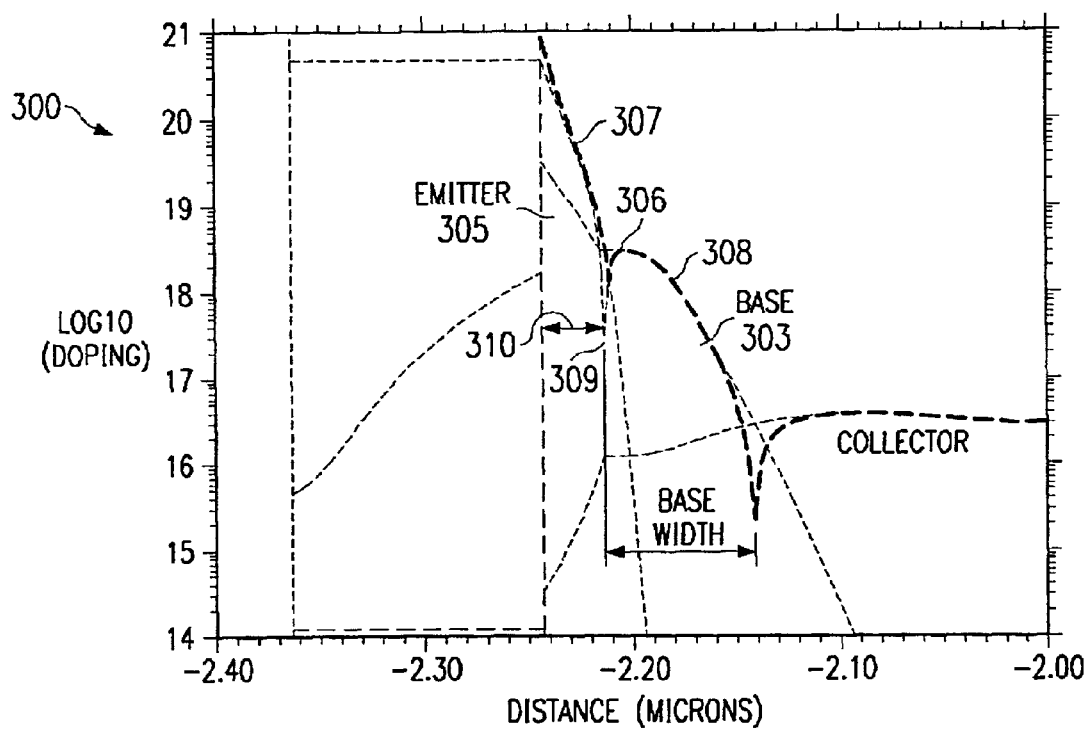
FIGS. 3A and 3B are doping density graphs illustrating doping density profiles of typical NPN and PNP bipolar junction transistors.
Figure 3B:
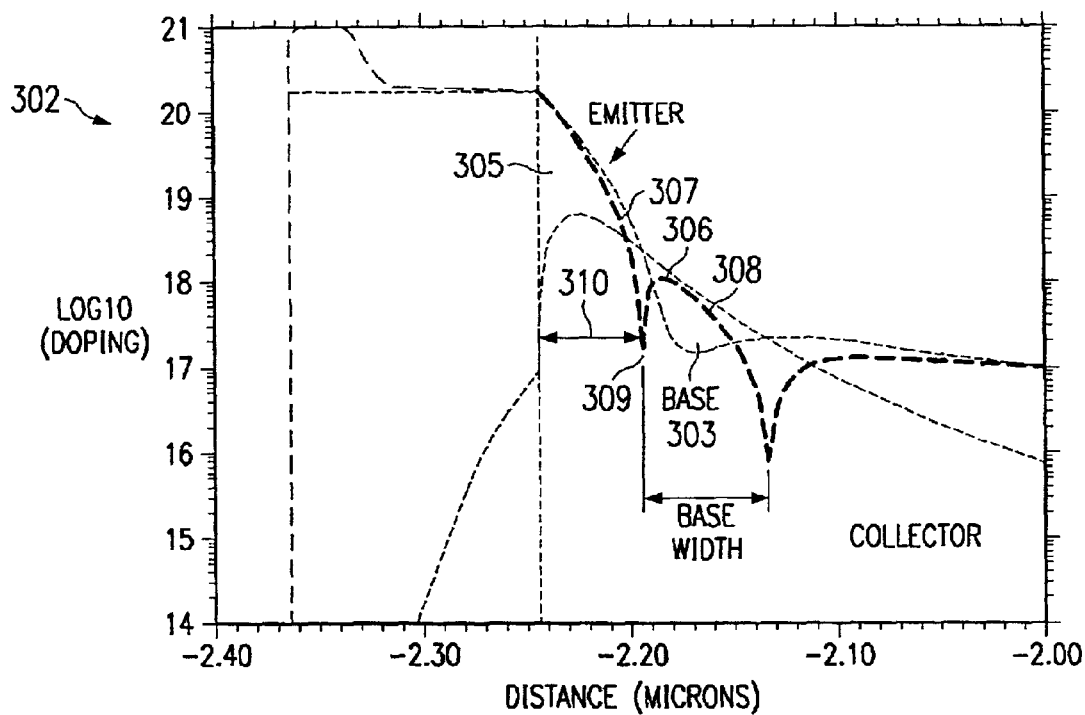

FIGS. 3A and 3B are doping density graphs (sometimes referred to as concentration versus depth graphs) illustrating a doping density graph 300 for an NPN bipolar junction transistor and a doping density graph 302 for a PNP bipolar junction transistor. The doping density profiles plot the doping concentration of various dopants along the y-axis and distance into semiconductor substrate 202 along the x-axis. As illustrated in FIGS. 3A and 3B, one problem with existing bipolar junction transistors is the tendency of a base dopant 303 to segregate towards a silicon surface 304 as an emitter dopant 305 diffuses. This segregation causes a base peak concentration 306 shown in graphs 300, 302. When emitter dopant 305 is diffused an emitter doping profile 307 intersects a base doping profile 308 along a downward slope of base doping profile 308 as shown by point 309 in graphs 300, 302. This is not a desired characteristic for a high performance bipolar junction transistor. Ideally, emitter doping profile 307 should intersect base doping profile 308 at, or near, base peak concentration 306 for optimum processing reproducibility and linearity.

Also shown in FIGS. 3A and 3B are emitter dopants 305 having emitter widths 310. Emitter width 310 indicates how deep emitter dopant 305 diffuses into the silicon. As is well known in the art of bipolar technology, the greater the emitter width the slower the bipolar junction transistor operates. The present invention addresses these problems, and others, as described below in conjunction with FIGS. 3C and 3D.

Figure 3D:
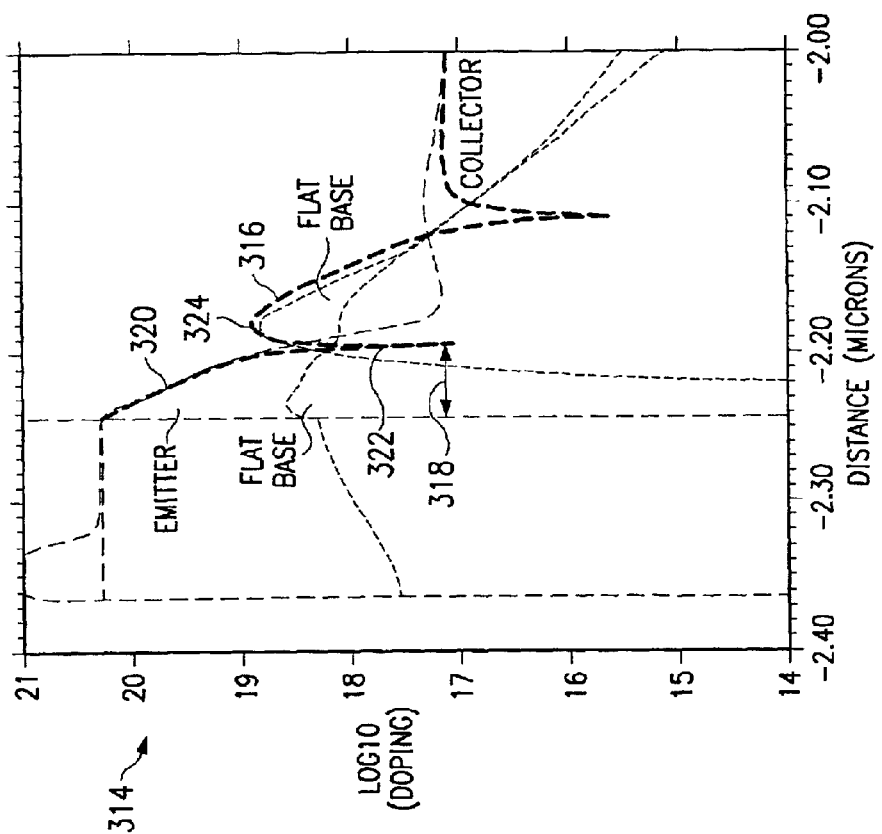
FIGS. 3C and 3D are doping density graphs illustrating doping density profiles of NPN and PNP bipolar junction transistors manufactured according to one embodiment of the teachings of the present invention.
Figure 3C:
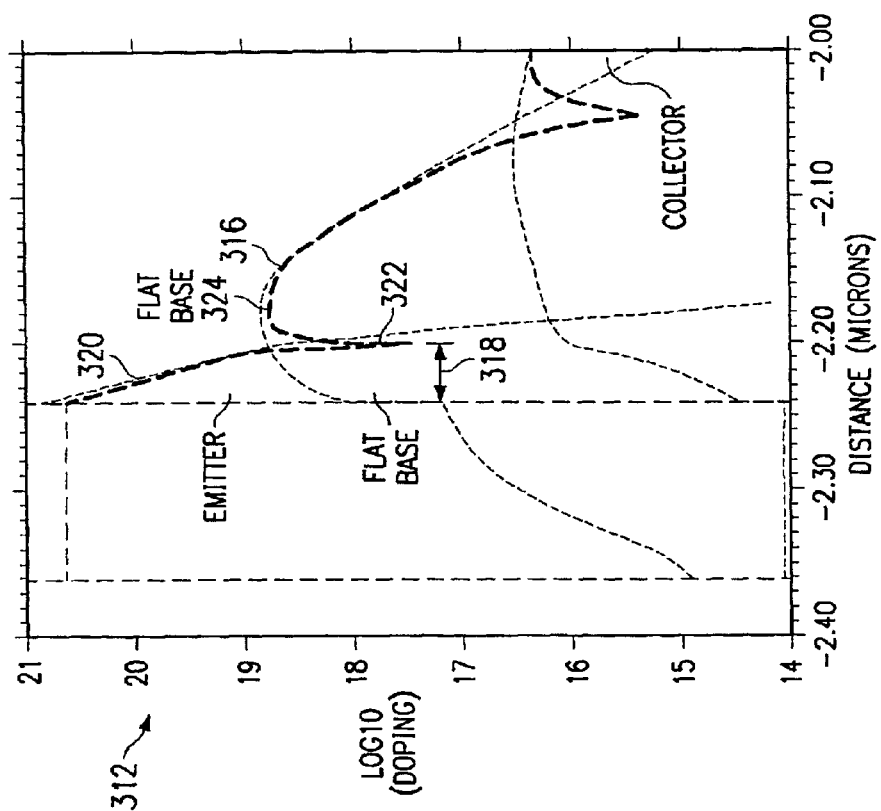

FIGS. 3C and 3D are doping density graphs illustrating a doping density profile 312 of an NPN BJT 102 and a doping density profile 314 of a PNP BJT 102 manufactured according to the teachings of the present invention. As shown in graphs 312, 314, a base doping profile 316 of BJT 102 has a more square/box like profile as opposed to the more pronounced base peak concentration 306 as shown in FIGS. 3A and 3B. In addition, an emitter width 318 is shown in FIGS. 3C and 3D to have a narrower width (i.e., shallower) than emitter width 310 as shown in FIGS. 3A and 3B. Furthermore, an emitter doping profile 320 intersects base doping profile 316 closer to a base peak concentration 324 than in standard bipolar junction transistors, as indicated by point 322 in graphs 312, 314. These desirable attributes of BJT 102 result from, in part, forming epitaxial silicon layer 209 as described above in conjunction with FIG. 2B. An annealing step as outlined above in conjunction with FIG. 2E may also be employed to further enhance these attributes of BJT 102. Therefore, according to the teachings of the present invention, a shallow emitter 230, a narrow-width base 229 with a square/box like doping profile, and a sharper emitter 230/base 229 junction results, thereby improving the overall performance of BJT 102.

Although embodiments of the invention and their advantages are described in detail, a person skilled in the art could make various alternations, additions, and omissions without departing from the spirit and scope of the present invention as defined by the appended claims.

What is claimed is:

1. A method used in manufacturing an intermediate structure in a bipolar junction transistor, comprising:
    forming a first epitaxial layer outwardly from a semiconductor substrate;
    implanting a base dopant in the first epitaxial layer; and
    after implanting the base dopant, forming a second epitaxial layer outwardly from the first epitaxial layer.

2. The method of claim 1, further comprising:
    forming a dielectric layer outwardly from the second epitaxial silicon layer;
    etching a portion of the dielectric layer to form an emitter region;
    forming an emitter polysilicon layer on the semiconductor substrate;
    implanting an emitter dopant in the emitter polysilicon layer;
    etching a portion of the emitter polysilicon layer and the dielectric layer to form an emitter polysilicon region;
    implanting a second base dopant in the semiconductor substrate; and
    after implanting the second base dopant, annealing the semiconductor substrate to form an emitter and a base.

3. The method of claim 1, wherein forming a second epitaxial layer comprises depositing epitaxial material having a thickness between approximately 100 and 1000 angstroms.

4. The method of claim 1, wherein forming a second epitaxial layer comprises depositing epitaxial material having a thickness between approximately 300 and 400 angstroms.

5. The method of claim 1, further comprising implanting a second base dopant in the first epitaxial layer after implanting the base dopant in the first epitaxial layer.

6. The method of claim 2, further comprising implanting a third base dopant in the semiconductor substrate after etching the portion of the dielectric layer.

7. The method of claim 2, further comprising annealing the semiconductor substrate at a temperature between approximately 1000° C. and 1100° C. for a time period between approximately 10 and 45 seconds after forming the emitter polysilicon layer.

8. A method of manufacturing a bipolar junction transistor, comprising:
    implanting a first base dopant in a semiconductor substrate;
    forming an epitaxial silicon layer outwardly from the semiconductor substrate;
    forming a dielectric layer outwardly from the epitaxial silicon layer;
    etching a first portion of the dielectric layer to form an emitter region;
    forming an emitter polysilicon layer on the semiconductor substrate;
    implanting an emitter dopant in the emitter polysilicon layer;
    etching a portion of the emitter polysilicon layer and a second portion of the dielectric layer to form an emitter polysilicon region having sidewalls;
    forming nitride regions on the sidewalls;
    implanting a second base dopant in the semiconductor substrate; and
    after implanting the second base dopant, annealing the semiconductor substrate to form an emitter and a base.

9. The method of claim 8, wherein forming an epitaxial silicon layer comprises depositing epitaxial silicon having a thickness between approximately 100 and 1000 angstroms.

10. The method of claim 8, wherein forming an epitaxial silicon layer comprises depositing epitaxial silicon having a thickness between approximately 300 and 400 angstroms.

11. The method of claim 8, further comprising annealing the semiconductor substrate at a temperature between approximately 1000° C. and 1100° C. for a time period between approximately 10 and 45 seconds after forming the emitter polysilicon layer.

12. The method of claim 8, further comprising implanting a third base dopant in the semiconductor substrate after implanting the first base dopant in the semiconductor substrate.

13. The method of claim 8, further comprising implanting a third base dopant in the semiconductor substrate after etching the first portion of the dielectric layer.

14. A method of manufacturing a bipolar junction transistor, comprising:
    forming isolation regions in a semiconductor substrate;
    forming a first epitaxial silicon layer outwardly from the semiconductor substrate;
    implanting a first base dopant in the semiconductor substrate;
    forming a second epitaxial silicon layer outwardly from the first epitaxial silicon layer;
    forming a first oxide layer outwardly from the second epitaxial silicon layer;
    forming a first nitride layer outwardly from the first oxide layer;
    etching a first portion of the first nitride layer and the first oxide layer to form an emitter region;
    forming an emitter polysilicon layer on the semiconductor substrate;
    implanting an emitter dopant in the emitter polysilicon layer;
    etching a portion of the emitter polysilicon layer, a second portion of the first nitride layer, and the first oxide layer to form an emitter polysilicon region having sidewalls;

forming a second oxide layer outwardly from the second epitaxial silicon layer, the emitter polysilicon region and the sidewalls;

forming a second nitride layer outwardly from the second oxide layer;

anisotropically etching the second nitride layer, thereby forming nitride regions on the sidewalls;

implanting a second base dopant in at least the second epitaxial silicon layer; and after implanting the second base dopant, annealing the semiconductor substrate to form an emitter and highly-doped base regions.

15. The method of claim 14, wherein forming a second epitaxial silicon layer comprises depositing epitaxial silicon having a thickness between approximately 100 and 1000 angstroms.

16. The method of claim 14, wherein forming a second epitaxial silicon layer comprises depositing epitaxial silicon having a thickness between approximately 300 and 400 angstroms.

17. The method of claim 14, further comprising implanting a third base dopant in the semiconductor substrate after implanting the first base dopant in the semiconductor substrate.

18. The method of claim 17, further comprising implanting a fourth base dopant in the semiconductor substrate after etching the first portion of the first nitride layer and the first oxide layer.

19. The method of claim 14, further comprising implanting a third base dopant in the semiconductor substrate after etching the first portion of the first nitride layer and the first oxide layer.

20. The method of claim 14, further comprising annealing the semiconductor substrate at a temperature between approximately 1000° C. and 1100° C. for a time period between approximately 10 and 45 seconds after forming the emitter polysilicon layer.

* * * * *